United States Patent
Azuma et al.

(10) Patent No.: US 10,700,260 B2
(45) Date of Patent: Jun. 30, 2020

(54) PIEZOELECTRIC CERAMIC SPUTTERING TARGET, LEAD-FREE PIEZOELECTRIC THIN FILM AND PIEZOELECTRIC THIN FILM ELEMENT USING THE SAME

(71) Applicant: TDK CORPORATION, Tokyo (JP)

(72) Inventors: Tomohisa Azuma, Tokyo (JP); Masaru Nanao, Tokyo (JP); Kenta Ishii, Tokyo (JP)

(73) Assignee: TDK CORPORATION, Tokyo (JP)

( * ) Notice: Subject to any disclaimer, the term of this patent is extended or adjusted under 35 U.S.C. 154(b) by 643 days.

(21) Appl. No.: 15/470,314

(22) Filed: Mar. 27, 2017

(65) Prior Publication Data

US 2017/0288127 A1  Oct. 5, 2017

(30) Foreign Application Priority Data

Mar. 29, 2016 (JP) ................. 2016-064898

(51) Int. Cl.
| | | |
|---|---|---|
| H01L 41/187 | (2006.01) |
| B32B 5/00 | (2006.01) |
| C04B 35/64 | (2006.01) |
| H01L 41/18 | (2006.01) |
| C23C 14/34 | (2006.01) |
| C23C 14/16 | (2006.01) |
| H01L 41/316 | (2013.01) |
| C23C 14/08 | (2006.01) |
| H01L 41/047 | (2006.01) |
| H01L 41/08 | (2006.01) |

(52) U.S. Cl.
CPC ............ *H01L 41/18* (2013.01); *C23C 14/088* (2013.01); *C23C 14/165* (2013.01); *C23C 14/3414* (2013.01); *H01L 41/047* (2013.01); *H01L 41/0805* (2013.01); *H01L 41/1873* (2013.01); *H01L 41/316* (2013.01)

(58) Field of Classification Search
CPC ... H01L 41/18; H01L 41/047; H01L 41/0805; H01L 41/1873; H01L 41/316; C23C 14/088; C23C 14/165; C23C 14/3414
USPC ....... 310/358; 501/134; 252/62.9 PZ, 62.9 R
See application file for complete search history.

(56) References Cited

U.S. PATENT DOCUMENTS

| | | | | |
|---|---|---|---|---|
| 2006/0006360 A1* | 1/2006 | Takao | ................... | C04B 35/495 252/62.9 R |
| 2006/0091588 A1* | 5/2006 | Nakamura | ............ | C04B 35/495 264/672 |

(Continued)

FOREIGN PATENT DOCUMENTS

| | | |
|---|---|---|
| JP | H11-335825 A | 12/1999 |
| JP | 2000-336474 A | 12/2000 |

(Continued)

*Primary Examiner* — Thomas M Dougherty
(74) *Attorney, Agent, or Firm* — Oliff PLC

(57) ABSTRACT

A piezoelectric ceramic sputtering target containing a perovskite type oxide represented by chemical formula (I) of $ABO_3$ as a main component, wherein the component A of the chemical formula (I) contains at least K (potassium) and/or Na (sodium), the component B of the chemical formula (I) contains at least Nb (niobium), the piezoelectric ceramic sputtering target is composed of a plurality of crystal grains; and the average particle diameter of the crystal grains is larger than 3 μm and not larger than 30 μm.

20 Claims, 2 Drawing Sheets

(56) References Cited

U.S. PATENT DOCUMENTS

| | | | | |
|---|---|---|---|---|
| 2009/0236557 A1* | 9/2009 | Hibino | ............ | C04B 35/491 |
| | | | | 252/62.9 R |
| 2010/0119800 A1* | 5/2010 | Yokoyama | ............ | C04B 35/475 |
| | | | | 428/220 |
| 2011/0012051 A1* | 1/2011 | Kaigawa | ............ | H01L 41/187 |
| | | | | 252/62.9 R |
| 2012/0161588 A1* | 6/2012 | Hatano | ............ | C04B 35/495 |
| | | | | 310/365 |
| 2015/0221856 A1* | 8/2015 | Ueda | ............ | C04B 35/495 |
| | | | | 347/70 |
| 2015/0368162 A1* | 12/2015 | Hayashi | ............ | B41J 2/14233 |
| | | | | 252/62.9 PZ |
| 2016/0351789 A1* | 12/2016 | Watanabe | ............ | B06B 1/0611 |
| 2017/0018701 A1* | 1/2017 | Ueda | ............ | H01L 41/1871 |
| 2017/0141292 A1* | 5/2017 | Kozuka | ............ | H01L 41/43 |
| 2017/0155031 A1* | 6/2017 | Furuta | ............ | G02B 7/04 |

FOREIGN PATENT DOCUMENTS

| | | |
|---|---|---|
| JP | 2015-534257 A | 11/2015 |
| WO | 2014/045121 A1 | 3/2014 |

\* cited by examiner

PIEZOELECTRIC CERAMIC SPUTTERING TARGET, LEAD-FREE PIEZOELECTRIC THIN FILM AND PIEZOELECTRIC THIN FILM ELEMENT USING THE SAME

The present invention relates to a piezoelectric ceramic sputtering target, a lead-free piezoelectric thin film and a piezoelectric thin film element using the same.

BACKGROUND

A piezoelectric ceramic exhibiting a so-called piezoelectric phenomenon is known in which mechanical distortion and stress are generated when an electric field is applied. Such a piezoelectric ceramic is used for a vibrating element such as an actuator, a sound generator, a sensor, or the like.

Lead zirconate titanate (Pb(Zr,Ti)$O_3$) with excellent piezoelectricity is most frequently used as the piezoelectric ceramic used in the above way. However, since lead zirconate titanate contains a large amount of lead, the influence on the global environment such as lead elution due to acid rain is regarded as a problem recently. Therefore, there is a need for lead-free piezoelectric ceramics to replace lead zirconate titanate, and various piezoelectric ceramics without lead have been proposed according to this requirement.

On the other hand, smaller size, higher performance and higher reliability are required with the electronic components, and the same trend is also found in piezoelectric components. Bulk bodies made by a sintering method are used in most piezoelectric components, however, it occurs that processing for controlling the thickness becomes extremely difficult as its thickness becomes smaller and that the size of the crystal grain size causes deterioration of properties. As a means to solve this problem, researches on piezoelectric thin films made by various thin film forming methods and its application in the element using the same have been actively conducted in recent years.

For example, a sputtering method is a representative thin film forming method. Its mechanism is that a voltage is applied between a substrate (anode side) on which a thin film is to be deposited and a target (cathode side) made of material for film deposition which is opposite to the substrate in an inert gas atmosphere such as argon atmosphere, by which ionized rare gas atoms are forced to collide with the target which is a cathode material, and the constituent atoms of the target are knocked out by the energy, whereby a thin film is deposited on the opposite substrate.

In the film deposition using a sputtering method along with the miniaturization of electronic components, thin films with higher precision and higher quality are required. As to the requirement for thin films with higher quality, specifically, preparation of thin films with high density and less defect becomes a problem. For example, generation of particles or nodules can be listed as a reason for defects in a thin film using a sputtering method.

With the increase of the sputtering time, minute protrusions called as nodules are generated on the target surface. Arcing is generated due to the nodule during sputtering, and fragments of nodules and the like are scattered as particles at that time. If the particles adhere to the thin film, defects will be generated in that part, which may lead to defect when made into a product. Therefore, the problem that how the generation of the particles can be suppressed is required to be solved in a sputtering target.

For example, Patent Document 1 discloses a method of suppressing the generation of particles during the manufacturing of the thin film by devising a manufacturing method of a lead-based sputtering target.

PATENT DOCUMENTS

Patent Document 1: JP-A-2000-336474

SUMMARY

During the preparation of a lead-free piezoelectric thin film, particularly the preparation of a niobium acid compound, there was a problem such as generation of particles which will become defects. However, sometimes it was not necessarily disclosed how to effectively solve this problem.

The present invention is achieved in view of the above circumstances and aims to provide a piezoelectric ceramic sputtering target in which generation of particles which will become defects can be sufficiently suppressed during the manufacturing of a lead-free piezoelectric thin film. Further, the present invention aims to provide a lead-free piezoelectric thin film and a piezoelectric thin film element formed by using the piezoelectric ceramic sputtering target.

In order to achieve the above aims, the present inventors made various studies on methods for sufficiently suppressing the generation of particles. As a result, it was found that the number of generated particles can be suppressed during the sputtering film deposition using a piezoelectric ceramic sputtering target by controlling the average particle diameter of the piezoelectric ceramic sputtering target.

That is, the present invention is a piezoelectric ceramic sputtering target comprising a perovskite type oxide represented by a chemical formula (I) of $ABO_3$ as a main component characterized in that the component A of the chemical formula (I) contains at least K (potassium) and/or Na (sodium), the component B of the chemical formula (I) contains at least Nb (niobium), the piezoelectric ceramic sputtering target is composed of a plurality of crystal grains, and the average particle diameter of the crystal grains is larger than 3 µm and not larger than 30 µm.

Thereby, the generation of particles can be sufficiently suppressed during the sputtering film deposition using a piezoelectric ceramic sputtering target.

The component A of the chemical formula (I) may further contain Sr (strontium) and/or Li (lithium).

The component B of the chemical formula (I) may further contain Ta (tantalum) and/or Zr (zirconium).

According to the present invention, it is possible to provide a piezoelectric ceramic sputtering target in which generation of particles which will become defects can be sufficiently suppressed during the manufacturing of a lead-free piezoelectric thin film. Further, it is also possible to provide a lead-free piezoelectric thin film and a piezoelectric thin film element formed by using the piezoelectric ceramic sputtering target.

DETAILED DESCRIPTION OF EMBODIMENTS

Figure 1:
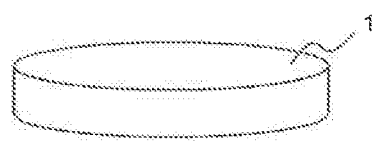
FIG. 1 is a perspective view showing an embodiment of a piezoelectric ceramic sputtering target according to the present invention.

Hereinafter, preferred embodiments of the present invention will be described below with reference to the drawings in some cases. Further, in the description of the drawings, same reference numerals are used for the same or equivalent elements, and repeated explanations are omitted.

(Piezoelectric Ceramic Sputtering Target)

FIG. 1 is a perspective view showing an embodiment of a piezoelectric ceramic sputtering target according to the present invention. Here, piezoelectric ceramic sputtering target 1 is constructed as an integral body. In addition, if necessary, processing for adjusting the flatness or thickness of the surface may be performed. The shape of piezoelectric ceramic sputtering target 1 is not necessarily circular. It may be elliptical, quadrilateral or polygonal. And there is no particular limitation on its size.

Figure 2:
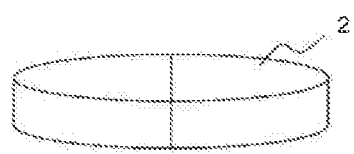
FIG. 2 is a perspective view showing another embodiment of a piezoelectric ceramic sputtering target according to the present invention.
Figure 2:
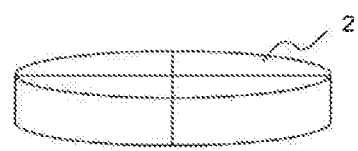
Figure 2:
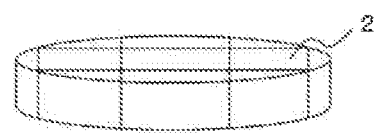

FIG. 2 is a perspective view showing another embodiment of the piezoelectric ceramic sputtering target of the present invention. Piezoelectric ceramic sputtering target 2 is composed of multiple divided pieces of two or more. Herein, the dividing lines are not necessarily straight lines, and they may be concentric circles or curved lines. Also, the shape of piezoelectric ceramic sputtering target 2 is not necessarily circular, and it may be elliptical, quadrilateral or polygonal. Likewise, there is no particular limitation on its size.

These piezoelectric ceramic sputtering targets 1 and 2 are fixed to, for example, a backing plate made of copper, then mounted on a sputtering apparatus, and sputtering deposition is performed.

The piezoelectric ceramic sputtering target of the present invention is characterized in that it comprises a perovskite type oxide represented by a chemical formula (I) of $ABO_3$ as a main component, wherein the component A of the chemical formula (I) contains at least K (potassium) and/or Na (sodium), the component B of the chemical formula (I) contains at least Nb (niobium), the piezoelectric ceramic sputtering target is composed of a plurality of crystal grains, and the average particle diameter of the crystal grains is larger than 3 µm and not larger than 30 µm. When the average particle diameter is 3 µm or less, the grain boundary region increases, and the components which are not contained in the crystal grains may cause particle generation. In addition, when the average particle diameter is more than 30 µm, the deviation of the compositions between the central portion and the edge portion of the crystal grain will be obvious, which may cause particle generation. The average particle diameter of the crystal grains is preferably larger than 4 µm and not larger than 20 µm. It is more preferably larger than 5 µm and not larger than 15 µm.

Sr (strontium) and/or Li (lithium) may be contained in the component A of the chemical formula (I). In addition, Ta (tantalum) and/or Zr (zirconium) may be contained in the component B of the chemical formula (I). By substituting the main components with these elements, it is easy to compensate for maintaining the molar ratio A/B of the component A and the component B of the perovskite type oxide. It is preferred that the amount of them is 20 mol % or less respectively relative to component A or component B.

As a subcomponent of the piezoelectric ceramic sputtering target, a component of at least one of Mn (manganese) and Cu (copper) may also be contained, the amount of which may be 1 mass % or less in terms of MnO (manganese oxide) and CuO (copper oxide) respectively relative to the composition of the chemical formula (I).

The piezoelectric ceramic sputtering target obtained as described above is bonded to a backing plate by using indium or the like as an adhesive.

(Method of Manufacturing a Piezoelectric Ceramic Sputtering Target)

Next, a method of manufacturing piezoelectric ceramic sputtering target 1 shown in FIG. 1 will be described below.

As the raw material of the main component of the piezoelectric ceramic sputtering target, for example, Na (sodium), K (potassium), Li (lithium), Nb (niobium), Ta (tantalum), Sr (strontium), Zr (zirconium) and Ba (barium) are prepared. Further, compound powders containing Mn (manganese) and Cu (copper), for example, is prepared as the subcomponent. Further, as the compound to be used as these raw materials, oxides or composite oxides of different elements or compounds such as carbonates and oxalates which will turn into oxides when heated can be used. Next, after these raw materials are sufficiently dried, they are weighed at such a ratio that the final composition will fall within the above-mentioned range. The ratio of the amount of the main component to the amount of the subcomponent is adjusted so that the ratio of the amount of the subcomponent when the main component and the subcomponent are taken as a whole becomes 3 mass % or less. The ratio of the amount of the subcomponent is preferably 1 mass % or less.

Next, these materials are mixed in an organic solvent or water using a ball mill, a bead mill or the like and then dried.

After calcining these materials at 650 to 1100° C., the calcined materials will be pulverized in an organic solvent or water with, for example, a ball mill, a bead mill or the like, and then dried to obtain a piezoelectric ceramic material powder.

A piezoelectric ceramic sputtering target according to an embodiment of the present invention is obtained by sintering the piezoelectric ceramic material powder and processing the shape.

For example, a binder is added to the piezoelectric ceramic material powder to granulate, and the granulated powder is press-molded using a uniaxial press molding machine or a cold isostatic press (CIP) or the like. The kind of the binder is not particularly limited, and it is not always necessary to use the binder if there is no problem in shape retention, handling property, sinterability and the like.

After shaping, for example, the molded compact is heated to remove the binder and further sintered at 950 to 1350° C. for 2 to 8 hours, by which a piezoelectric ceramic sintered body is obtained. Further, the average particle diameter can be controlled by adjusting the sintering temperature, sintering time, heating rate, cooling rate, atmosphere and the like according to the composition of the main component.

In order to control the average particle diameter to be in an appropriate range, it is preferable to appropriately decrease the heating rate during the sintering of the compact. Thereby, a preferable average particle diameter can be obtained.

Next, a processing to adjust the size of the outer circumference or the thickness, the surface conditions such as the surface roughness and the like can be performed to the resulted piezoelectric ceramic sintered body, if necessary, and piezoelectric ceramic sputtering target 1 can be obtained.

The piezoelectric ceramic sputtering target 1 obtained as described above is bonded on the backing plate by using indium or the like as the adhesive, and is mounted onto a sputtering apparatus to be used in the film deposition.

Next, the manufacturing method of the piezoelectric ceramic sputtering target 2 according to another embodiment of the present invention will be described. The same steps from weighing, mixing, calcinating to granulation as those in the manufacturing of the above piezoelectric ceramic sputtering target 1 are carried out.

After granulation, the granulated powder can be press molded using a uniaxial press molding machine or a cold isostatic press (CIP) or the like to obtain a molded compact. The area of the molded compact at this stage is smaller than the final area of the completed target, but two or more pieces necessary for obtaining the final area of the completed target are prepared.

After molding, for example, the molded compact is heated to remove the binder, and further sintered at 950 to 1350° C. for 2 to 8 hours, by which a piezoelectric ceramic is obtained. Further, the average particle diameter can be controlled by adjusting the sintering temperature, sintering time, heating rate, cooling rate, atmosphere and the like according to the composition of the main component.

After sintering, the size of the outer circumference or the thickness, the surface conditions such as the surface roughness and the like can be adjusted if necessary, however, it is formed so as to obtain the final area after completion when the pieces have been adhered. Herein, the dividing lines are not necessarily straight lines, and they may be concentric circles or curved lines. Further, the shape is not necessarily circular, and it may be elliptical, quadrilateral or polygonal.

The piezoelectric ceramic sputtering target 2 obtained as described above is bonded in a way that pieces are adhered to each other on the backing plate by using indium or the like as the adhesive, and is mounted onto a sputtering apparatus to be used in the film deposition.

The divided type of piezoelectric ceramic sputtering target 2 as shown in FIG. 2 is used in the steps for obtaining the piezoelectric ceramic sintered body when the size of the piezoelectric ceramic sintered body which can be manufactured cannot satisfy the size of the target piezoelectric ceramic sputtering target 2, or when the molding pressure for increasing the density of the piezoelectric ceramic sintered body is demanded to be ensured in certainty. Thus, the manufacturing processes are basically the same as the processes of the above-described piezoelectric ceramic sputtering target 1 respectively. However, when it is bonded to the backing plate at last, precise surface processing is required so that individual divided targets can be assembled without gaps.

(Piezoelectric Thin Film Element)

The piezoelectric ceramic sputtering target obtained as described above is fixed to a copper backing plate by using indium as the adhesive.

Hereinafter, the term "substrate" means a body to be deposited with a film in each step. A silicon wafer as a substrate is placed in a vacuum chamber of an RF sputtering apparatus. After the vacuum exhausting, Pt (platinum) is deposited as a lower electrode layer with a film thickness of 50 to 350 nm.

Subsequently, the substrate is transferred to a chamber of an RF sputtering apparatus in which a piezoelectric ceramic sputtering target with a backing plate is mounted. After the vacuum exhausting, a reverse sputtering is performed to the substrate. As the atmospheric gas during the reverse sputtering, Ar (argon) is supplied into the chamber. A power of 100 to 1000 W is applied under a pressure of 0.5 to 1.5 Pa and a treatment is performed for 5 to 300 seconds.

Following the reverse sputtering, a lead-free piezoelectric thin film is deposited as a piezoelectric layer on the substrate by using the piezoelectric ceramic sputtering target with the backing plate. The substrate temperature during the film deposition is 500 to 800° C., and the thickness of the piezoelectric layer is 1000 to 3500 nm.

Figure 3:
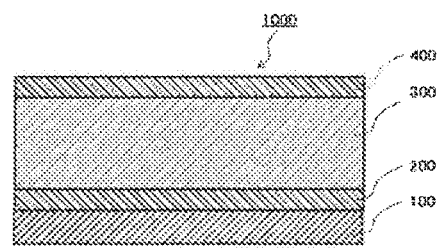
FIG. 3 is a cross-sectional view showing an embodiment of a lead-free piezoelectric thin film element formed by using a piezoelectric ceramic sputtering target according to the present invention.

Thereafter, an upper electrode Pt is deposited with a film thickness of 50 to 350 nm by sputtering. Thereby, as shown in FIG. 3, piezoelectric thin film element 1000 constituted by substrate 100, lower electrode 200, lead-free piezoelectric thin film 300, and upper electrode 400 in this order is obtained. It may be cut or insulating coated if necessary. Further, piezoelectric thin film element 1000 may be a structure in which lead-free piezoelectric thin film 300 is sandwiched between lower electrode 200 and upper electrode 400, and substrate 100 may be omitted.

EXAMPLES

Hereinafter, the present invention will be described more specifically based on Examples and Comparative Examples; however, the present invention is not to be limited to the following Examples.

Comparative Example 1

Piezoelectric ceramic sputtering target 1 as shown in FIG. 1 was prepared by the following steps. First, $Na_2CO_3$ (sodium carbonate) powder, $K_2CO_3$ (potassium carbonate) powder, and $Nb_2O$ (niobium oxide) powder were prepared. After these raw materials were sufficiently dried, each raw material was weighed so that the final composition would be as following formula (1).

$$(K_{0.400}Na_{0.600})_{0.975}NbO_3 \tag{1}$$

$Na_2CO_3$ (sodium carbonate) powder, $K_2CO_3$ (potassium carbonate) powder and $Nb_2O_5$ (niobium oxide) powder weighed as described above were sufficiently mixed in ethanol using a ball mill, then dried and press-molded, and calcinated under 950° C. for 2 hours.

After the mixture was calcined, the calcined product was sufficiently pulverized in ethanol using a ball mill, dried again, and granulated by adding a binder (PVA: polyvinyl alcohol) solution. The obtained granulated powder was press-molded using a uniaxial press-molding machine to obtain a molded compact. If there was no problem in fabrication, binder might not be necessarily used. Thereafter, CIP molding was carried out, and this molded compact was heated to 600° C. to remove the binder. After a further CIP molding, a piezoelectric ceramic sintered body was obtained by sintering at 1100° C. for 2 hours in an atmospheric ambient with a heating rate of 200° C./hour. With respect to the piezoelectric ceramic sintered body obtained thereby, it was confirmed by XRD (Rigaku Smart Lab) that it was a perovskite structure and no different phase exists.

The obtained piezoelectric ceramic sintered body was subject to a surface grinding to obtain piezoelectric ceramic sputtering target 1. The obtained piezoelectric ceramic sputtering target 1 was fixed to a copper backing plate using indium as an adhesive.

Subsequently, sputtering was performed using the piezoelectric ceramic sputtering target 1 attached with the backing plate in order to confirm the generation of particles during the film deposition of the piezoelectric ceramic sputtering target 1. Hereinafter, an example of the sputtering deposition process will be described.

A silicon wafer with a diameter of 3 inches and a thickness of 400 μm with a thermal oxide film ($SiO_2$: insulating layer) as a substrate was placed in a vacuum chamber of an RF sputtering apparatus. After vacuum exhausting, Pt (platinum) was deposited as an electrode layer. The substrate temperature during film deposition was 400° C., and the thickness of the electrode layer was 200 nm.

Subsequently, the substrate was transferred to a chamber of an RF sputtering apparatus to which a piezoelectric ceramic sputtering target 1 with a backing plate was mounted. After vacuum exhausting was performed, a reverse sputtering was performed on the substrate. Ar (argon) was supplied with a speed of 50 sccm into the chamber as an atmosphere gas during the reverse sputtering, and a power of 500 W was applied under a pressure of 1 Pa to treat for 30 seconds.

Following the reverse sputtering, a lead-free piezoelectric thin film was deposited as a piezoelectric layer on the substrate by using piezoelectric ceramic sputtering target 1 with the backing plate. The substrate temperature during film deposition was 600° C., and the thickness of the piezoelectric layer was 2000 nm.

After the deposition of the piezoelectric layer, the number of particles with a diameter of 0.2 μm or more on the piezoelectric layer was measured using Topcon WM-3 as a wafer surface inspecting device. The particle density was calculated by dividing the number of particles by the area of the wafer.

The grain size distribution of the particle diameter was determined by image analysis based on a scanning electron microscopic photograph of an embedded polished cross-section of the piezoelectric ceramic sputtering target (sintered compact) which was etched. Specifically, the size and the number of the grains were measured from the scanning electron microscopic photograph using an image processing software of Mac-view. The particle diameter was taken as the Heywood diameter, and the grain size distribution was calculated from the volume distribution. The magnification of the scanning electron microscopic photograph was set to be a magnification at which 50 or more grains were obtained. Then, the average particle diameter (D50) was determined and it was taken as the average particle diameter of the piezoelectric ceramic sputtering target.

Examples 1 to 8, Comparative Examples 2 and 3

The preparation method and the evaluation method were the same as those in Comparative Example 1 except that the composition of the composite oxide which was the main component of the piezoelectric ceramic sputtering target was set as the formula (1) and the heating rate during the sintering process was set as shown in Table 1.

Hereinafter, the raw materials were used properly according to the composition formula. Powders of $Na_2CO_3$ (sodium carbonate), $K_2CO_3$ (potassium carbonate), $Li_2CO_3$ (lithium carbonate), $Nb_2O_5$ (niobium oxide), $Ta_2O_5$ (tantalum oxide), $SrCO_3$ (strontium carbonate), $ZrO_2$ (zirconium oxide) and $BaCO_3$ (zirconium oxide) were prepared. In addition, powders of CuO (copper oxide) and $MnCO_3$ (manganese carbonate) were prepared as the raw materials of the subcomponent.

Example 9

Piezoelectric ceramic sputtering target 1 as shown in FIG. 1 was prepared by the following steps. The preparation method and the evaluation method were the same as those in Comparative Example 1 except that the raw materials were weighed respectively so that a final composition of the following formula (2) would be obtained after the raw materials were sufficiently dried, and the heating rate during the sintering process was set as shown in Table 1.

$$(K_{0.381}Na_{0.571}Sr_{0.048})_{0.975}NbO_3 \quad (2)$$

Example 10

The preparation method and the evaluation method were the same as those in Comparative Example 1 except that the raw materials were weighed respectively so that a final composition of the following formula (3) would be obtained after the raw materials were sufficiently dried, and the heating rate during the sintering process was set as shown in Table 1.

$$(K_{0.381}Na_{0.571}Li_{0.048})_{0.975}NbO_3 \quad (3)$$

Example 11

The preparation method and the evaluation method were the same as those in Comparative Example 1 except that the raw materials were weighed respectively so that a final composition of the following formula (4) would be obtained after the raw materials were sufficiently dried, and the heating rate during the sintering process was set as shown in Table 1.

$$(K_{0.362}Na_{0.542}Li_{0.048}Sr_{0.048})_{0.975}NbO_3 \quad (4)$$

Example 12

The preparation method and the evaluation method were the same as those in Comparative Example 1 except that the raw materials were weighed respectively so that a final composition of the following formula (5) would be obtained after the raw materials were sufficiently dried, and the heating rate during the sintering process was set as shown in Table 1.

$$(K_{0.400}Na_{0.600})_{0.975}(Nb_{0.900}Ta_{0.100})O_3 \quad (5)$$

Example 13

The preparation method and the evaluation method were the same as those in Comparative Example 1 except that the raw materials were weighed respectively so that a final composition of the following formula (6) would be obtained after the raw materials were sufficiently dried, and the heating rate during the sintering process was set as shown in Table 1.

$$(K_{0.400}Na_{0.600})_{0.975}(Nb_{0.952}Zr_{0.048})O_3 \quad (6)$$

Example 14

The preparation method and the evaluation method were the same as those in Comparative Example 1 except that the raw materials were weighed respectively so that a final composition of the following formula (7) would be obtained after the raw materials were sufficiently dried, and the heating rate during the sintering process was set as shown in Table 1.

$$(K_{0.400}Na_{0.600})_{0.975}(Nb_{0.857}Ta_{0.095}Zr_{0.048})O_3 \quad (7)$$

Example 15

The preparation method and the evaluation method were the same as those in Comparative Example 1 except that the raw materials were weighed respectively so that a final composition of the following formula (8) would be obtained after the raw materials were sufficiently dried, and the heating rate during the sintering process was set as shown in Table 1.

$$(K_{0.359}Na_{0.540}Li_{0.048}Ba_{0.005}Sr_{0.048})_{0.975}$$
$$(Nb_{0.857}Ta_{0.095}Zr_{0.048})O_3 \quad (8)$$

Example 16

The preparation method and the evaluation method were the same as those in Comparative Example 1 except that the raw materials were weighed respectively so that a final composition of the following formula (9) would be obtained after the raw materials were sufficiently dried, and the heating rate during the sintering process was set as shown in Table 1.

$$(K_{0.359}Na_{0.540}Li_{0.048}Ba_{0.005}Sr_{0.048})_{0.975}$$
$$(Nb_{0.857}Ta_{0.095}Zr_{0.048})O_3 + CuO\ 0.5\ mass\ \% \quad (9)$$

Example 17

The preparation method and the evaluation method were the same as those in Comparative Example 1 except that the raw materials were weighed respectively so that a final composition of the following formula (10) would be obtained after the raw materials were sufficiently dried, and the heating rate during the sintering process was set as shown in Table 1.

$$(K_{0.359}Na_{0.540}Li_{0.048}Ba_{0.005}Sr_{0.048})_{0.975}$$
$$(Nb_{0.857}Ta_{0.095}Zr_{0.048})O_3 + MnCO_3\ 0.5\ mass\ \% \quad (10)$$

The measured results were described below using Table 1.

Table 1 showed the composition formula, the heating rate during the sintering process, the average particle diameter of the piezoelectric ceramic sputtering target and the particle density for Examples 1 to 17 and Comparative Examples 1 to 3.

In addition, in Table 1, when the particle density was $11.0 \times 10^3/m^2$ or more, defect of voltage withstanding would occur frequently, so that it was determined to be not preferable and the determination was "×". When the particle density was $9.0 \times 10^3/m^2$ or more and less than $11.0 \times 10^3/m^2$, it was determined to be a preferable film and the determination was "Δ". When the particle density was $7.0 \times 10^3/m^2$ or more and less than $9.0 \times 10^3/m^2$, it was determined to be a more preferable film and the determination was "○". When the particle density was less than $7.0 \times 10^3/m^2$, it was determined to be a further more preferable film and the determination was "◉".

TABLE 1

| | Composition Formula | Heating rate (° C./hr) | Average particle diameter (μm) | Particle density ($10^3/m^2$) | Determination |
|---|---|---|---|---|---|
| Comparative Example 1 | (1) | 200 | 2.8 | 11.3 | X |
| Example 1 | (1) | 100 | 3.1 | 9.2 | Δ |
| Example 2 | (1) | 90 | 4.2 | 7.1 | ○ |
| Example 3 | (1) | 80 | 5.2 | 6.7 | ◉ |
| Example 4 | (1) | 70 | 7.6 | 3.5 | ◉ |
| Example 5 | (1) | 60 | 9.9 | 4.6 | ◉ |
| Example 6 | (1) | 50 | 14.8 | 6.6 | ◉ |
| Example 7 | (1) | 40 | 19.8 | 8.7 | ○ |
| Example 8 | (1) | 30 | 29.9 | 9.9 | Δ |
| Comparative Example 2 | (1) | 20 | 32.6 | 11.0 | X |
| Comparative Example 3 | (1) | 10 | 42.6 | 12.3 | X |

TABLE 1-continued

| | Composition Formula | Heating rate (° C./hr) | Average particle diameter (μm) | Particle density ($10^3/m^2$) | Determination |
|---|---|---|---|---|---|
| Example 9 | (2) | 100 | 4.4 | 8.5 | ○ |
| Example 10 | (3) | 100 | 4.6 | 8.2 | ○ |
| Example 11 | (4) | 100 | 5.1 | 6.8 | ◉ |
| Example 12 | (5) | 100 | 4.8 | 8.1 | ○ |
| Example 13 | (6) | 100 | 4.9 | 8.0 | ○ |
| Example 14 | (7) | 100 | 5.2 | 6.6 | ◉ |
| Example 15 | (8) | 100 | 5.6 | 5.6 | ◉ |
| Example 16 | (9) | 100 | 6.1 | 4.8 | ◉ |
| Example 17 | (10) | 100 | 6.5 | 4.3 | ◉ |

From these results, it was possible to reduce the particle density of the lead-free piezoelectric thin film when producing a lead-free piezoelectric thin film using these piezoelectric ceramic sputtering targets in which the average particle diameter was controlled to be larger than 3μm and not larger than 30 μm. Particularly, in the examples in which the average particle diameter of the crystal grains was in the range of larger than 4 μm and not larger than 20 μm, especially in the range of larger than 5 μm and not larger than 15 μm, remarkable reduction effect of particle density could be observed.

As the lead-free piezoelectric thin film produced by the piezoelectric ceramic sputtering target of the present invention reduces defects caused by particle adhesion, it is possible to provide a piezoelectric thin film element with low defective rate and high reliability. For example, it is also useful for piezoelectric sensors such as yaw rate sensors, acceleration sensors, pressure sensors, vibration sensors, pulse wave sensors, and the like, in addition to piezoelectric actuators or ink jet printers of head assemblies of hard disk drives.

DESCRIPTION OF REFERENCE NUMERALS 1, 2 piezoelectric ceramic sputtering target
100 substrate
200 lower electrode
300 lead-free piezoelectric thin film
400 upper electrode
1000 piezoelectric thin film element

What is claimed is:

1. A piezoelectric ceramic sputtering target comprising a perovskite type oxide represented by chemical formula (I) of $ABO_3$ as a main component, wherein the component A of the chemical formula (I) contains at least K (potassium) and/or Na (sodium),
the component B of the chemical formula (I) contains at least Nb (niobium),
the piezoelectric ceramic sputtering target is composed of a plurality of crystal grains,
an average particle diameter of the crystal grains after firing is larger than 3 μm and not larger than 30 μm, and
a particle density of the crystal grains after firing is less than $11.0 \times 10^3/m^2$.

2. The piezoelectric ceramic sputtering target of claim 1, wherein the component A further contains Sr (strontium) and/or Li (lithium).

3. The piezoelectric ceramic sputtering target of claim 1, wherein the component B further contains Ta (tantalum) and/or Zr (zirconium).

4. The piezoelectric ceramic sputtering target of claim 1, wherein Mn (manganese) and/or Cu (copper) are/is further contained as a subcomponent, and the subcomponent is contained in an amount of 1 mass % or less when Mn and Cu are calculated in terms of MnO and CuO respectively.

5. A lead-free piezoelectric thin film deposited by using the piezoelectric ceramic sputtering target of claim 1.

6. A piezoelectric thin film element comprising the lead-free piezoelectric thin film of claim 5, a lower electrode and an upper electrode sandwiching the lead-free piezoelectric thin film.

7. A lead-free piezoelectric thin film deposited by using the piezoelectric ceramic sputtering target of claim 2.

8. A lead-free piezoelectric thin film deposited by using the piezoelectric ceramic sputtering of claim 3.

9. A lead-free piezoelectric thin film deposited by using the piezoelectric ceramic sputtering of claim 4.

10. A lead-free piezoelectric thin film deposited by using the piezoelectric ceramic sputtering of claim 3, wherein the component A further contains Sr (strontium) and/or Li (lithium).

11. A lead-free piezoelectric thin film deposited by using the piezoelectric ceramic sputtering of claim 4, wherein the component A further contains Sr (strontium) and/or Li (lithium).

12. A lead-free piezoelectric thin film deposited by using the piezoelectric ceramic sputtering of claim 4, wherein the component B further contains Ta (tantalum) and/or Zr (zirconium).

13. A lead-free piezoelectric thin film deposited by using the piezoelectric ceramic sputtering of claim 4, wherein the component A further contains Sr (strontium) and/or Li (lithium), and the component B further contains Ta (tantalum) and/or Zr (zirconium).

14. A piezoelectric thin film element comprising the lead-free piezoelectric thin film of claim 7, a lower electrode and an upper electrode sandwiching the lead-free piezoelectric thin film.

15. A piezoelectric thin film element comprising the lead-free piezoelectric thin film of claim 8, a lower electrode and an upper electrode sandwiching the lead-free piezoelectric thin film.

16. A piezoelectric thin film element comprising the lead-free piezoelectric thin film of claim 9, a lower electrode and an upper electrode sandwiching the lead-free piezoelectric thin film.

17. A piezoelectric thin film element comprising the lead-free piezoelectric thin film of claim 10, a lower electrode and an upper electrode sandwiching the lead-free piezoelectric thin film.

18. A piezoelectric thin film element comprising the lead-free piezoelectric thin film of claim 11, a lower electrode and an upper electrode sandwiching the lead-free piezoelectric thin film.

19. A piezoelectric thin film element comprising the lead-free piezoelectric thin film of claim 12, a lower electrode and an upper electrode sandwiching the lead-free piezoelectric thin film.

20. A piezoelectric thin film element comprising the lead-free piezoelectric thin film of claim 13, a lower electrode and an upper electrode sandwiching the lead-free piezoelectric thin film.

* * * * *